US007257383B2

(12) United States Patent
Young et al.

(10) Patent No.: US 7,257,383 B2
(45) Date of Patent: Aug. 14, 2007

(54) METHOD AND SYSTEM FOR IMPROVING DYNAMIC RANGE FOR COMMUNICATION SYSTEMS USING UPSTREAM ANALOG INFORMATION

(75) Inventors: Christopher Young, Cupertino, CA (US); Tushar Moorti, Mountain View, CA (US)

(73) Assignee: Broadcom Corporation, Irvine, CA (US)

( * ) Notice: Subject to any disclaimer, the term of this patent is extended or adjusted under 35 U.S.C. 154(b) by 427 days.

(21) Appl. No.: 10/810,405

(22) Filed: Mar. 26, 2004

(65) Prior Publication Data

US 2005/0215211 A1  Sep. 29, 2005

Related U.S. Application Data

(60) Provisional application No. 60/551,267, filed on Mar. 8, 2004.

(51) Int. Cl.
*H04B 17/02* (2006.01)

(52) U.S. Cl. ............... 455/138; 455/136; 455/253.2; 455/240.1; 455/246.1; 455/251.1; 330/133; 330/129; 375/345; 375/317

(58) Field of Classification Search .............. 455/138, 455/239.1, 240.1, 295, 311, 550.1, 575.1, 455/186.1, 557, 127.3, 136, 324, 312, 241.1–250.1, 455/253.2, 418, 412.1, 63.1, 561, 424, 425, 455/137, 456.5, 456.6, 127.2, 341, 251.1, 455/420; 375/345, 316, 317, 324, 319; 330/133, 330/129, 124, 134, 136, 278; 341/155, 180, 341/139; 327/309, 312, 317, 321
See application file for complete search history.

(56) References Cited

U.S. PATENT DOCUMENTS 4,823,129 A * 4/1989 Nelson ..................... 341/139

5,095,536 A * 3/1992 Loper ....................... 455/324
5,274,377 A * 12/1993 Matsuura et al. ........... 341/161
5,392,044 A * 2/1995 Kotzin et al. ............... 341/155
5,438,691 A * 8/1995 Muto ........................ 455/309
5,451,955 A * 9/1995 Sullivan .................... 341/200
5,864,310 A * 1/1999 Khorramabadi ............. 341/118

(Continued)

FOREIGN PATENT DOCUMENTS

WO   WO99/45653   9/1999

(Continued)

*Primary Examiner*—Edward F. Urban
*Assistant Examiner*—Charles Chow
(74) *Attorney, Agent, or Firm*—McAndrews, Held & Malloy, Ltd.

(57) ABSTRACT

The receiver is provided which comprises a mixer, a low pass filter coupled to the mixer and a plurality of gain controllers serially coupled to an output of the low pass filter (LPF). A plurality of analog-to-digital converters (ADCs) is coupled so that an input of a first of the ADCs is coupled to the output of the LPF. An input of each of a remaining portion of the ADCs is individually coupled to a corresponding output of each of the serially coupled gain blocks. An output path traced from the output of the LPF to an output of each of the analog-to-digital converters may be referred to as a processing path. Each processing path may comprise a gain controller and an ADC, except for the first processing path, which may have an ADC coupled directly to the output of the LPF.

30 Claims, 9 Drawing Sheets

U.S. PATENT DOCUMENTS

| | | | |
|---|---|---|---|
| 6,304,206 B1 * | 10/2001 | Wada et al. | 341/162 |
| 6,373,907 B1 * | 4/2002 | Katsura et al. | 375/345 |
| 6,498,927 B2 * | 12/2002 | Kang et al. | 455/245.2 |
| 6,668,027 B1 * | 12/2003 | Scarpa | 375/345 |
| 7,031,409 B2 * | 4/2006 | Brobston et al. | 375/345 |
| 2001/0022821 A1 * | 9/2001 | Ichihara | 375/317 |
| 2002/0047744 A1 * | 4/2002 | Ichihara | 330/133 |
| 2002/0070803 A1 | 6/2002 | Rzyski | |
| 2002/0149535 A1 | 10/2002 | Toncich | |
| 2003/0012313 A1 * | 1/2003 | Husted et al. | 375/345 |
| 2003/0218501 A1 * | 11/2003 | Oshima et al. | 330/133 |
| 2004/0121746 A1 * | 6/2004 | Akamine et al. | 455/130 |
| 2004/0180643 A1 * | 9/2004 | Ono et al. | 455/326 |
| 2004/0229586 A1 * | 11/2004 | Oshima et al. | 455/240.1 |

FOREIGN PATENT DOCUMENTS

| | | |
|---|---|---|
| WO | WO00/18023 | 3/2000 |
| WO | WO01/74000 A1 | 10/2001 |
| WO | WO02/13402 A2 | 2/2002 |

* cited by examiner

METHOD AND SYSTEM FOR IMPROVING DYNAMIC RANGE FOR COMMUNICATION SYSTEMS USING UPSTREAM ANALOG INFORMATION

CROSS-REFERENCE TO RELATED APPLICATIONS/INCORPORATION BY REFERENCE

This application makes reference to, claims priority to, and claims the benefit of U.S. Provisional Application Ser. No. 60/551,267 filed Mar. 8, 2004.

The above stated application is hereby incorporated herein by reference in its entirety.

FIELD OF THE INVENTION

Certain embodiments of the invention relate to packet based wireless communication systems. More specifically, certain embodiments of the invention relate to a method and system for improving dynamic range for communication systems such as 802.11 systems using upstream analog information.

BACKGROUND OF THE INVENTION

In packet-based wireless communication systems, a transmitted packet may be received with a large range of signal strengths, that is, a wide dynamic range. For example, in an 802.11 system, there may be as much as a 100 dB difference in signal strength between packets received at receiver A sent from transmitter B versus a packet received by receiver A sent from transmitter C. Factors accounting for this variation include path loss and fading characteristics of a RF propagation channel, for example. Path loss may include attenuation losses incurred due to the distance existing between a transmitter and a receiver. Fading characteristics of the RF propagation channel may include multipath interference destructively combining to reduce the strength of the signal received at the receiver. A well-designed communication transceiver must perform reliably given these impairments that are characteristic of wireless media. In this regard, a goal of a well-designed communication transceiver is to mitigate these characteristic impairments. In order to achieve this goal, a practical receiver may make use of automatic gain control (AGC). Automatic gain control can be described as an algorithm that may be adapted to automatically adjust signal size in order to maximize some parameter.

Figure 1:
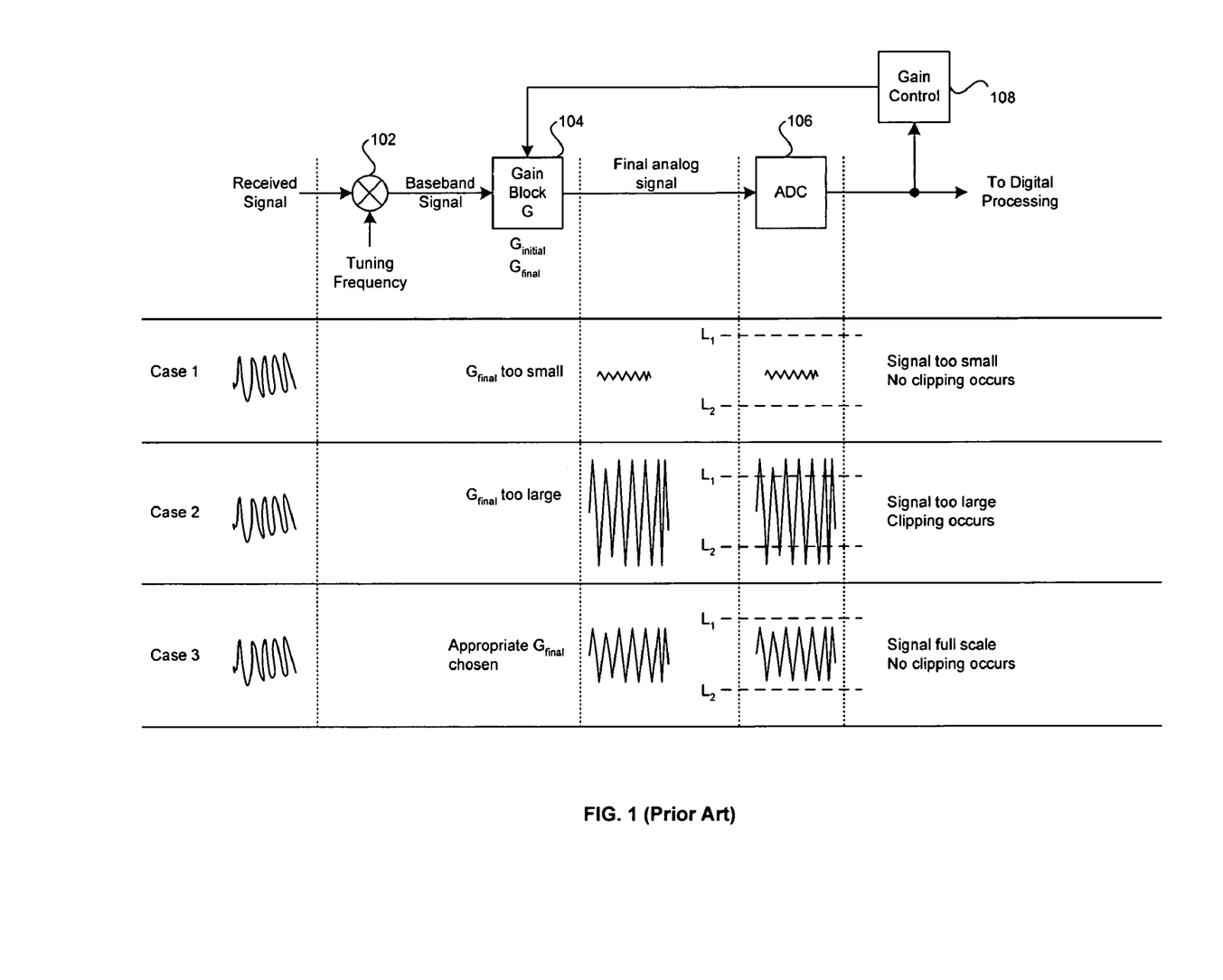
FIG. 1 is a block diagram of a conventional receiver system that utilizes gain control.

FIG. 1 is a block diagram of a conventional receiver system that utilizes gain control. Referring to FIG. 1, the conventional receiver comprises a mixer 102, a gain block 104, analog-to-digital converter (ADC) 106 and gain control block 108. The conventional receiver may be part of a packet-based wireless system, which is adapted to receive a signal that is transmitted at a particular carrier frequency.

In operation, the mixer 102 receives an input received signal and mixes the received signal with a tuning frequency to generate a baseband signal. The gain block 104 applies an initial gain $G_{initial}$ to the baseband signal, and the AGC algorithm will apply a final gain output gain $G_{final}$ to the data portion of the packet. The analog to digital converter (ADC) 106 converts the analog signal to digital samples, which are subsequently processed.

A good AGC algorithm that may be implemented in the gain block 108, is adapted to choose or provide a final gain value $G_{final}$ dB to apply to the data portion of the packet such that the signal to quantization noise ratio out of the ADC is maximized. Additionally, the final gain value $G_{final}$ dB is chosen so that it is not too large as to cause an overflow to occur at the ADC during reception of the packet. The first criterion maximizes the signal to quantization noise ratio (SQNR) for the packet, and the second criterion prevents the packet from almost certainly being received with errors due to signal distortion. A well-designed gain block 108 is configured to execute an AGC algorithm that will accomplish this task.

Referring to FIG. 1, in $L_1$ and $L_2$ represents the limits of the ADC 106. In case 1, $G_{final}$ is too small and the resulting analog signal, which is an input to the ADC 106, does not optimally utilize the limits $L_1$ and $L_2$ of the ADC 106. Accordingly, the AGC algorithm would have made a poor decision or choice. In case 2, $G_{final}$ is too large and the resulting analog signal, which is an input to the ADC 106, does not optimally utilize the limits $L_1$ and $L_2$ since these limits of the ADC 106 are exceeded. Since the limits $L_1$, $L_2$ of the ADC are exceeded, clipping of the signal occurs. Accordingly, the AGC algorithm would have made a poor decision or choice. In case 3, $G_{final}$ is ideal and the resulting analog signal, which is an input to the ADC 106, optimally utilizes the limits $L_1$ and $L_2$ of the ADC 106. In this case, no clipping of the analog signal occurs. Accordingly, the AGC algorithm would have made an ideal decision or choice.

For 802.11 orthogonal frequency division multiplexing (OFDM) systems, the gain $G_{final}$ is calculated and applied during the preamble portion of the packet. The preamble of the packet is relatively short in time compared to the overall packet length, and corrections for other system impairments such as frequency offset may also need to be calculated during this portion of the transmission. Thus, the amount of time needed to determine the proper gain setting for the received packet needs to be kept small. For a practical 802.11a/g orthogonal frequency division multiplexing system, this means it is likely at most one intermediate gain setting $G_{intermediate}$ is allowed during the preamble to determine the final gain $G_{final}$.

Figure 2:
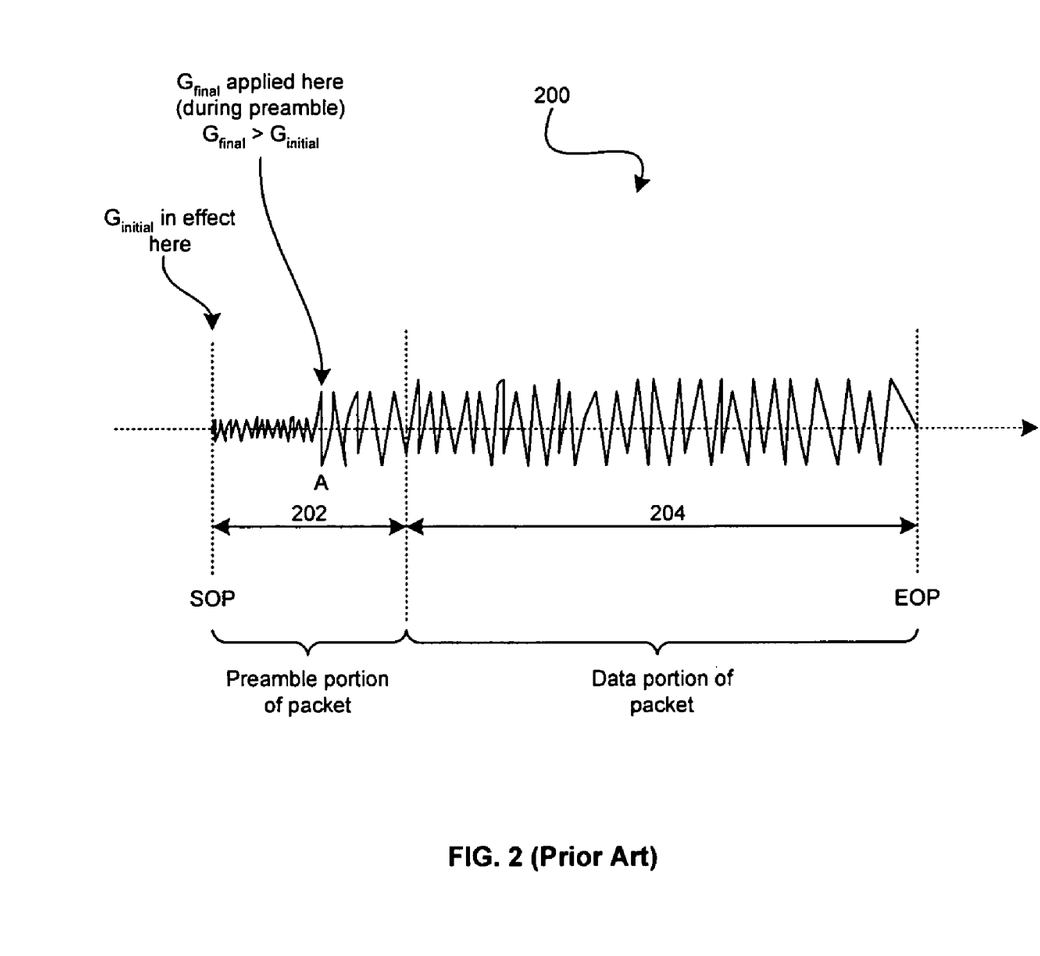
FIG. 2 is a diagram illustrating the application of gain to a packet.

FIG. 2 is a diagram illustrating the application of gain to a packet. Referring to FIG. 2, there is shown a packet 200 having a preamble portion 202 and a data portion 204. The leftmost portion of the packet 200 is the demarcation of the start of packet (SOP) and the rightmost portion of the packet 200 is the demarcation of the end-of-packet EOP. The gain $G_{final}$ is applied at reference A, which occurs during the preamble portion 202 of the packet 200. In this case, $G_{final}$ is greater than $G_{initial}$ ($G_{final} > G_{initial}$).

Figure 3:
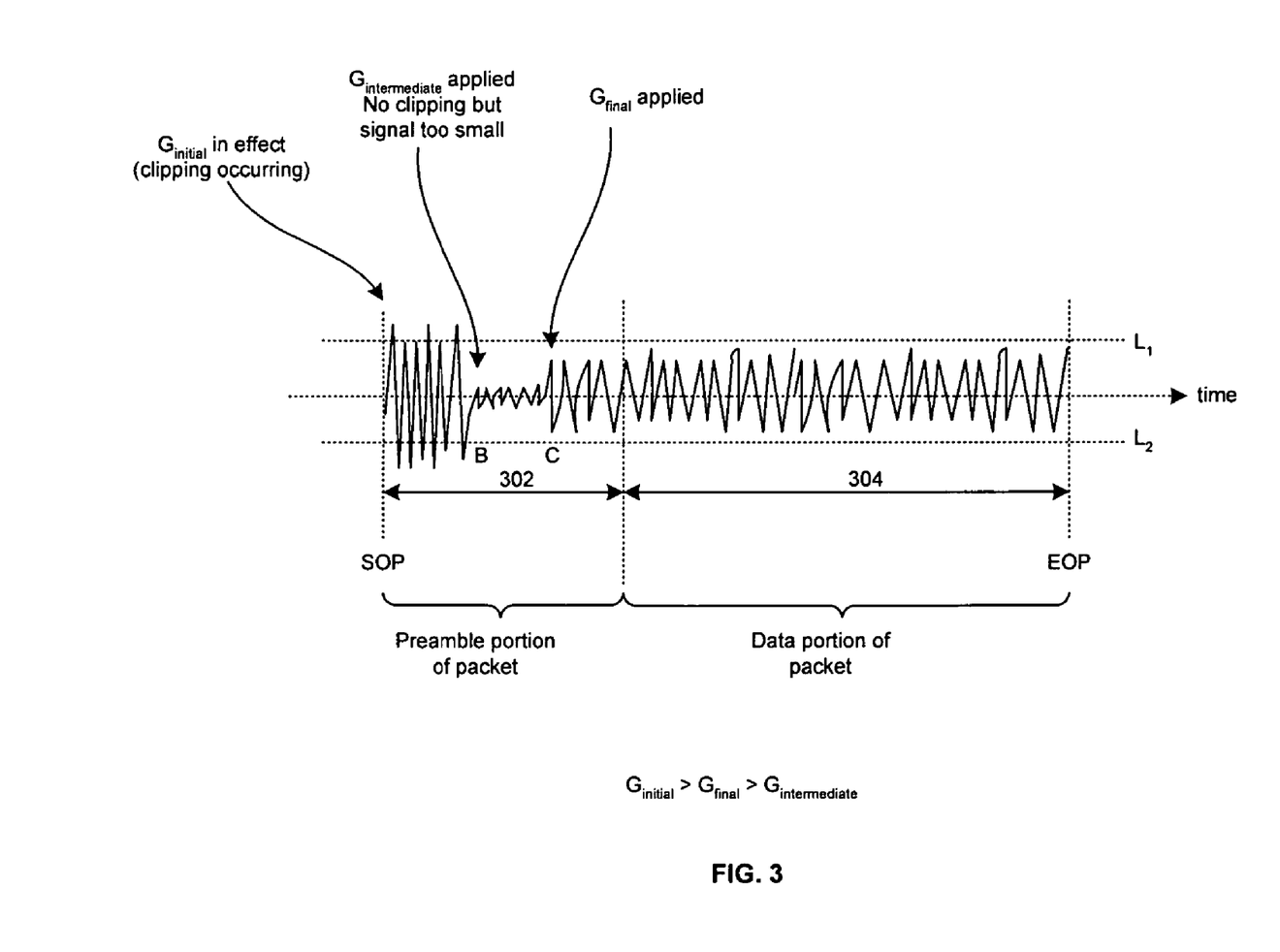
FIG. 3 is a diagram illustrating the application of gain to a packet.

FIG. 3 is a diagram illustrating the application of gain to a packet. Referring to FIG. 3, there is shown a packet 300 having a preamble portion 302 and a data portion 304. The leftmost portion of the packet 300 is the demarcation of the start of packet (SOP) and the rightmost portion of the packet 300 is the demarcation of the end-of-packet EOP. A gain $G_{initial}$ is in effect at the start-of-packet (SOP) where clipping is occurring. A gain $G_{intermediate}$ is applied at reference B where no clipping occurs but the signal is too small. A gain $G_{final}$ is applied at reference C where no clipping occurs and the signal is ideal. In this case, $G_{initial}$, $G_{intermediate}$ and $G_{final}$ are applied during the preamble.

In order for a receiver to detect small receiver signal input, the initial front-end gain $G_{initial}$ must necessarily be set to a large value. However, if the incoming signal is in fact large, the signal level at the output of the ADC will be clipped, making it difficult to determine the received signal power. That is, if a received signal power of X dBm is enough to cause a clip at the ADC, then all received signal powers greater than X dBm also cause a clip.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention may be found in a method and system for improving dynamic range using upstream analog information. Aspects of the method may comprise generating a plurality of upstream analog signals for a received signal. Upstream analog information related to at least a portion of the generated plurality of upstream analog signals may be acquired. A gain for the received signal may be adjusted using at least a portion of the acquired upstream analog information to increase dynamic range of the received signal.

The received signal is low pass filtered to generate a plurality of narrowband analog signals. At least one sample may be acquired from at least a portion of the generated plurality of upstream analog signals and a power for the received signal may be computed based on the acquired sample or samples. A determination may be made as to whether the generated plurality of upstream analog signals is clipped. An intermediate gain may be generated based on the computed power of the acquired sample and applied to one or more of the generated plurality of upstream analog signals if the signal is clipped. The computed power may be compared to a plurality of defined power values and a gain selected based on the comparison. The defined power values may be stored in lookup table, for example. A final gain may be applied to the received signal. The generated plurality of upstream analog signals may be converted to corresponding time domain signals.

Another embodiment of the invention may provide a machine-readable storage, having stored thereon, a computer program having at least one code section executable by a machine, thereby causing the machine to perform the steps as described above for processing received signals in a communication system.

Another embodiment of the invention provides a system for processing received signals. Aspects of the system may comprise a receiver that generates a plurality of upstream analog signals for a received signal. The generated plurality of upstream analog signals may be narrowband analog signals. At least one processor may acquire upstream analog information related to at least a portion of the generated plurality of upstream analog signals. At least one automatic gain controller may be adapted to adjust a gain for the received signal using at least a portion of the acquired upstream analog information to increase a dynamic range of the received signal.

The system may further comprise at least one low pass filter that filters the received signal. The processor may acquire at least one sample from at least a portion the generated plurality of upstream analog signals and compute a power based on the acquired sample. The processor may be adapted to determine when at least one of the generated plurality of upstream analog signal is clipped. The automatic gain controller may generate an intermediate gain based on the computed power of the acquired sample. The processor may apply the generated intermediate gain to the generated plurality of upstream analog signals. After comparing the computed power to a plurality of defined power values, which may be stored in a lookup table, the processor may select a gain based on a comparable power value. The automatic gain controller may be utilized to apply a final gain to the received packet. The receiver may be adapted to convert the generated plurality of upstream analog signals to corresponding time domain signals.

Another embodiment of the invention provides a receiver for processing received communication signals. The receiver may comprise a mixer, a low pass filter coupled to the mixer and a plurality of gain block serially coupled to an output of the low pass filter. The system may also comprise a plurality of analog to digital converters, wherein an input of a first of the analog-to-digital converters is coupled to the output of the low pass filter. An input of each of a remaining portion of the analog-to-digital converters is individually coupled to a corresponding output of each of the serially coupled gain blocks. An output path traced from the output of the low pass filter to an output of each of the analog-to-digital converters may be referred to as a processing path. Accordingly, each of the processing paths may comprise a gain controller and an analog to digital converter, except for the first processing path, which may have an ADC coupled directly to the output of the low pass filter.

These and other advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for improving dynamic range using upstream analog information. One aspect of the invention employs narrow band direct out (NBDO) signal and/or wideband received signal strength indicator (WRSSI) aided automatic gain control (NBDO/WRSSI-aided AGC) which observes the received input signal further upstream in the processing chain such as in the earlier stages of analog processing. Digital samples of NBDO information may be utilized to determine a more accurate gain to be applied in order to provide a more accurate calculation of the received signal power for automatic gain control. Accordingly, a wide range in the received input powers may be more efficiently and accurately demodulated.

In one aspect of the invention, a correct gain setting which is to be applied may be determined by observing a received signal before it reaches an analog to digital converter (ADC). In other words, upstream analog information may be utilized to determine an optimal gain that should be applied to the received signal. Digital samples of narrowband direct out (NBDO) information generated by low pass filtering the received signal may be utilized to provide a more accurate calculation of the received signal power for automatic gain control. Accordingly, after applying the determined gain, a wider range in the received input powers may be correctly demodulated.

Figure 4:
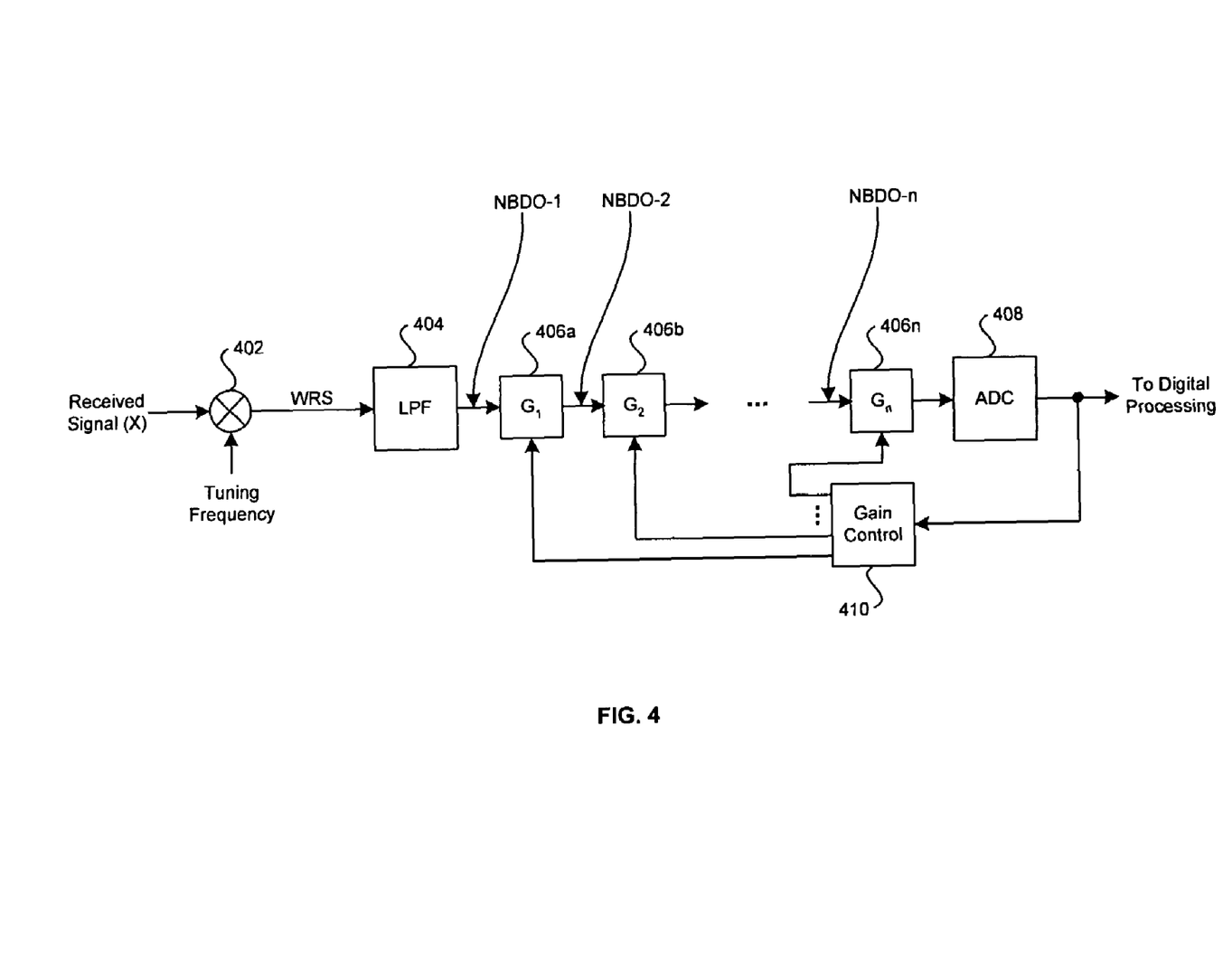
FIG. 4 is a block diagram of a receiver that may be utilized for improving dynamic range using upstream analog information in accordance with an embodiment of the invention.

FIG. 4 is a block diagram of a receiver that may be utilized for improving dynamic range using upstream analog information in accordance with an embodiment of the invention. Referring to FIG. 4, the receiver comprises a mixer 402, a low pass filter (LPF) block 404, a plurality of gain (G) blocks 406a, 406b, . . . , 406n, and analog-to-digital converter (ADC) block 408. The receiver may be part of a packet-based wireless system, which may be adapted to receive a signal that is transmitted at a particular carrier frequency.

In operation, the mixer 402 receives an input received signal X and mixes the received signal with a tuning frequency to generate a baseband signal. The resulting baseband signal may be referred to as a wideband received signal (WRS) and an indication of its signal strength may be referred to as a wideband received signal strength indicator (WRSSI). The resulting baseband signal is low pass filtered by the low pass filter block 404 to generate a narrowband signal which may be referred to as a first narrowband direct output (NBDO-1) signal.

In the analog processing chain of FIG. 4, an overall gain G may be applied in a plurality of gain stages. For example, the analog section may comprise n stages, each of which applies a corresponding gain $G_1, G_2, \ldots, G_n$ (dB) respectively. Accordingly, the overall gain G is given by:

$$G = G_1 + G_2 + \ldots + G_n.$$

Referring to FIG. 4, each of the gain blocks i applies a gain $G_i$ to a narrowband direct signal that it receives. In this regard, the gain block 406a applies an initial gain $G_1$ dB to the first narrowband signal NBDO-1 and generates an analog second narrowband signal NBDO-2. The gain block 406b applies a gain $G_2$ dB to the second narrowband signal NBDO-2 and generates an analog narrowband signal NBDO-3, and so on. The gain block 406(n) applies a gain $G_n$ dB to the $n^{th}$ narrowband signal NBDO-n and generates an output that is provided as an input to the ADC 408. The analog to digital converter (ADC) 408 converts the analog signal to digital samples, which are subsequently processed.

In order to detect small receiver signal inputs, the overall initial gain $G_{initial}$ may be set to a large value. However, if the incoming input signal X is itself large, then the overall signal $Y=(10^{\wedge}(G_{initial}/20))*X$ seen at the output of the ADC 408 may be large enough such that clipping will occur at the ADC 408, and thus the output of the ADC 408 will not provide reliable information of the signal strength of X. In this case, it may not be possible to use the output of the ADC 408 to determine an appropriate final gain $G_{final}$ to be applied to the data portion of the packet. To address this issue, if the outputs of the intermediate stages of the analog processing chain are available, for example WRSSI, NBDO-1, NBDO-2, then these outputs offer an earlier view of the signal before it reaches the ADC. The signals, which are earlier in the processing chain, will necessarily be smaller and may not already be clipped. If the gains $G_1, G_2, \ldots, G_n$ are known, it is possible to narrow down a range within which the input signal lies.

Figure 5:
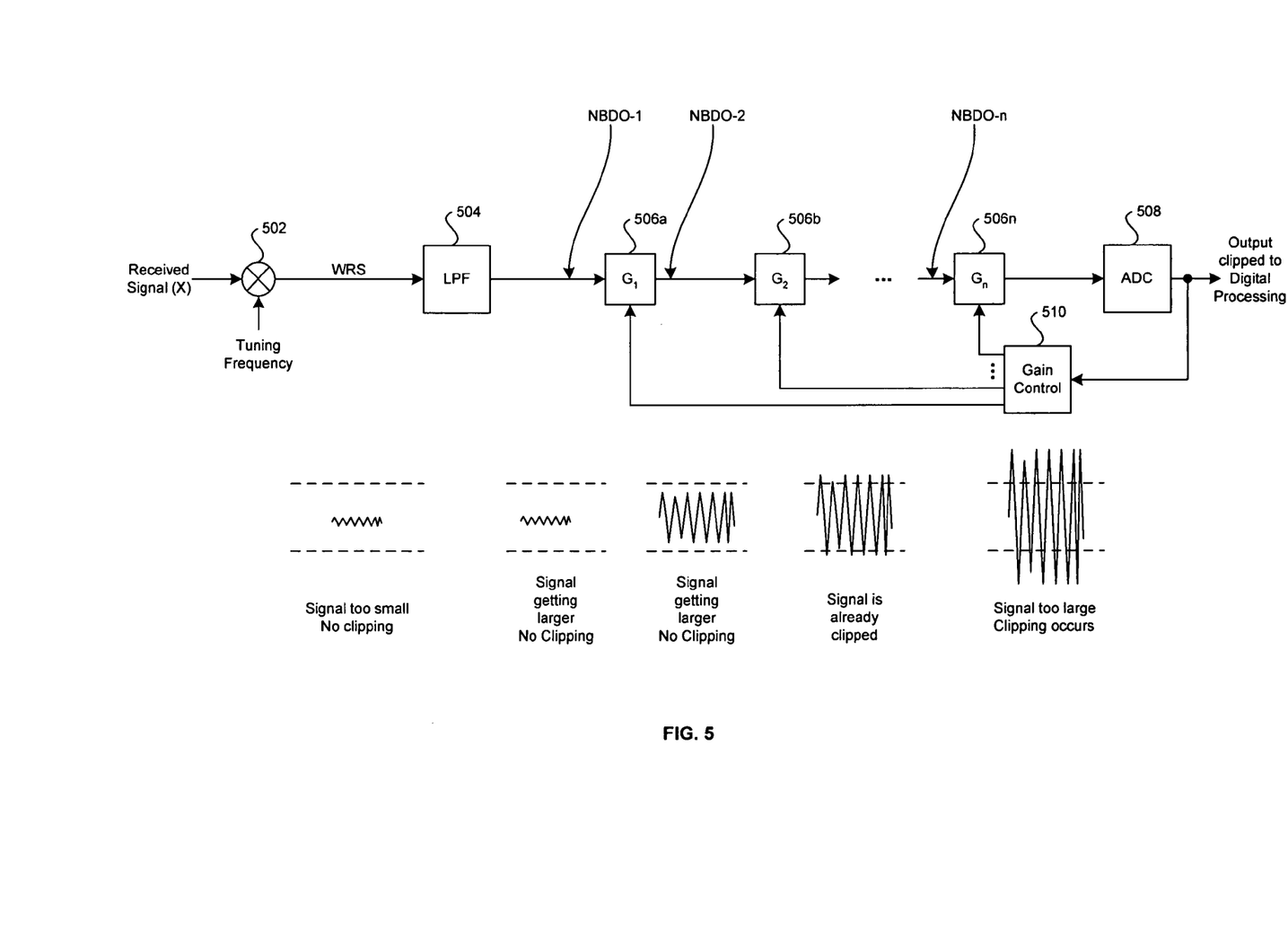
FIG. 5 is a block diagram illustrating variations in signal sizes as gain is applied to a baseband signal in the processing chain of FIG. 4 in accordance with an embodiment of the invention.

FIG. 5 is a block diagram illustrating variations in signal sizes as gain is applied to a baseband signal in the processing chain of FIG. 4 in accordance with an embodiment of the invention. Referring to FIG. 5, the receiver comprises a mixer 502, a low pass filter (LPF) block 504, a plurality of gain (Gi) blocks 506a, 506b, . . . 506n, and analog-to-digital converter (ADC) block 508. As more gain is applied to the baseband signal, the signal gets larger and larger until clipping starts to occur.

There may be, in general, insufficient granularity of the information provided by WRSSI, NBDO-1, NBDO-2, and so on, to determine a final packet gain $G_{final}$ with enough accuracy with just the initial gain setting $G_{initial}$. Although the 802.11a/g OFDM preamble is relatively short in time compared to the length of the packet, there is still sufficient time to allow at least one intermediate gain change before a final gain has to be applied to the rest of the packet and still perform other tasks that need to be accomplished during the preamble. Thus, an intermediate gain $G_{intermediate}$ may be chosen based on the output of the analog gain stage outputs. If the intermediate gain is appropriately chosen, then digital samples will not clip, and these samples may be used to determine a good final gain value $G_{final}$.

In general, the output of the intermediate gain stages requires processing in order to determine the received input signal power. The raw data by itself may be insufficient to accurately determine the power level. In an aspect of the invention, analog blocks may be utilized to accomplish this processing. While this may seem relatively simple to do, in practice, there may be enough variation to make the calculated received input power somewhat unreliable for an AGC algorithm. A more reliable method may comprise sampling the NBDO-x outputs with ADCs and calculating the power in the digital domain. In this regard, the variation in analog processing may be removed.

Figure 6:
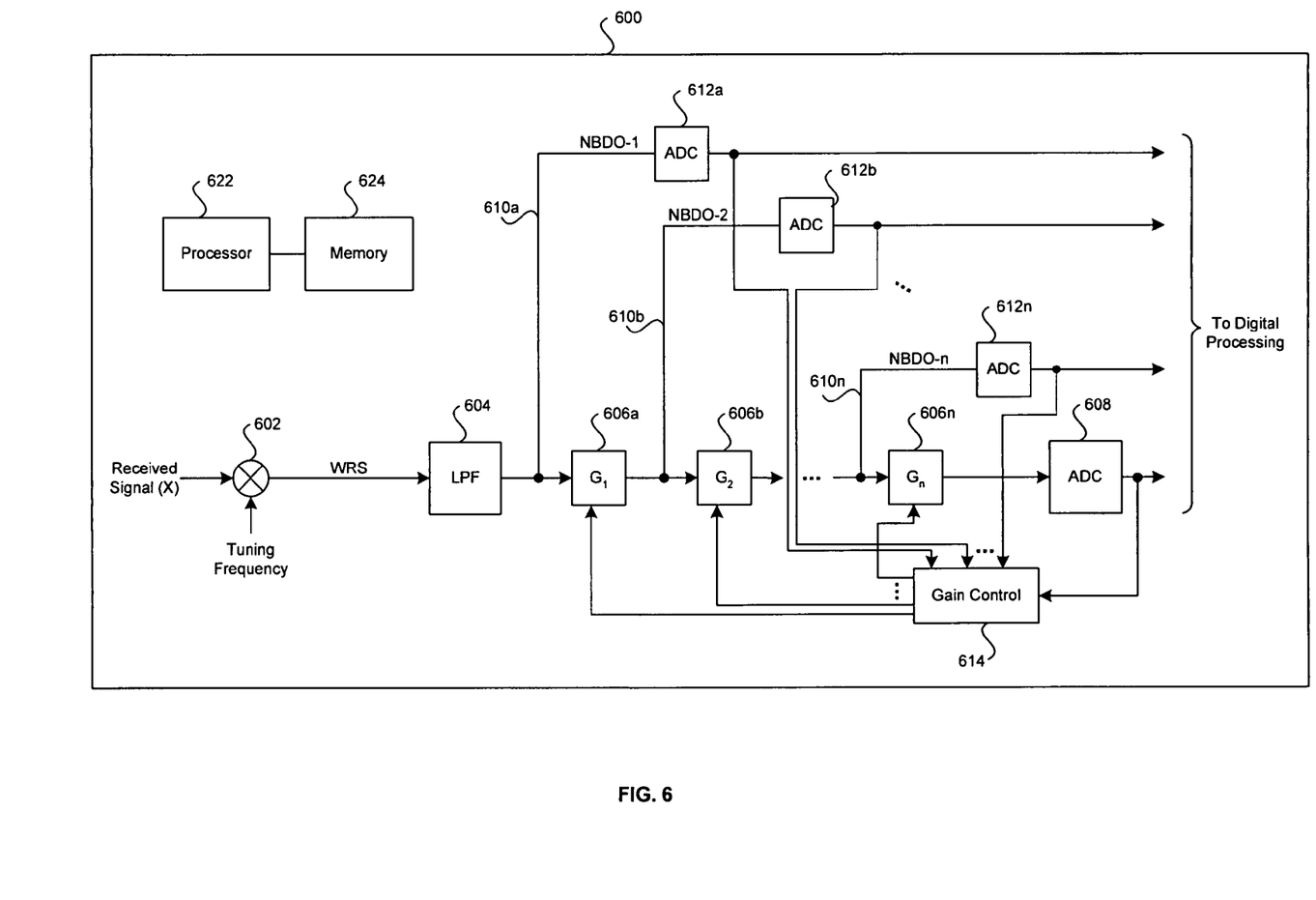
FIG. 6 is a block diagram of a receiver that may be utilized for improving dynamic range using upstream analog information in accordance with an embodiment of the invention.

FIG. 6 is a block diagram of a receiver 600 that may be utilized for improving dynamic range using upstream analog information in accordance with an embodiment of the invention. Referring to FIG. 6, the receiver comprises a mixer 602, a low pass filter (LPF) 604, a plurality of gain blocks 606a, 606b, . . . , 606n, analog-to-digital converters (ADC) 612a, 612b, 612c, . . . , 612n, gain control block 614 and ADC processing paths 610a, 610b, . . . , 610n. The receiver of FIG. 6 may also comprise a processor block 622 and a memory block 624.

An input of the low pass filter 604 may be coupled to an output of the mixer 602. The plurality of gain blocks 606a, 606b, ..., 606n, may be serially coupled to an output of the low pass filter 604. A first ADC 612a of the plurality of analog-to-digital converters 612a, 612b, ..., 612n may be coupled to the output of the low pass filter 604. An input of each of a remaining portion of the analog-to-digital converters, namely 612b, ..., 612n, may be individually coupled to a corresponding output of each of the serially coupled gain blocks 606a, 606b, ..., 606n. In this regard, analog-to-digital converter 612b is coupled to an output of gain block 606a, and analog-to-digital converter 612n is coupled to an output of gain block 606(n–1) (not shown), for example. The analog-to-digital converter 608 may be coupled to an output of gain block 606n.

An output path traced from the output of the low pass filter 604 to an output of each of the analog-to-digital converters 612a, 612b, ..., 612n may be referred to as a processing path. Accordingly, each of the processing paths may comprise a gain block and an analog to digital converter, except for the first processing path, which may have an analog-to-digital converter 612a coupled directly to the output of the low pass filter 604. Each of the processing paths may be adapted to apply a different gain to a narrow band direct out (NBDO) signal, which may be generated at an output of the low pass filter 604 and/or from successive serially coupled gain blocks 606a, 606b, ..., 606n. In the configuration of FIG. 6, processing path 610a may be utilized to ADC process signal NBDO-1, processing path 610b may be utilized to ADC process signal NBDO-2, ..., and processing path 610n may be utilized to ADC process signal NBDO-n.

In an illustrative embodiment of the invention, consider a case where an 802.11 a/g OFDM preamble, for example, is received. If it is determined that a clip has occurred at the ADC during the preamble, the AGC algorithm may examine the WRSSI and NBDO-x values. The output(s) of these signals may be sampled, and a power calculation may be done based on a summation of the magnitude squared of the samples.

Although it may not be feasible to have all NBDO-x outputs available as digital samples and since ADCs are relatively large power consuming devices, a subset of these signals may still be quite useful. For example, assume that only the NBDO-1 signal is being utilized and it is sampled for a short training period of 0.8 µsec at a rate of 40 Msamples/sec. Then, the collected power is given by:

$$\text{Power from } NBDO\text{-}1 = \sum_{j=1}^{32} (\text{samples of } NBDO\text{-}1)(j)^2)$$

A value of the collected power may be compared to a table of thresholds, which correspond to an input signal power at fixed values. Based on this comparison, an intermediate gain may be applied which may enable detection of carrier sense (CS) and prevent clipping at the ADC. This intermediate gain may provide a more accurate power estimate that may be utilized by the automatic gain controller to determine a more precise final gain that is to be applied to the packet. In this regard a plurality of intermediate gains may be generated and these intermediate gains may be utilized to more accurately determine final gain to be applied to the packet by the AGC. FIG. 6 shows a single channel of received signals from the output of a single mixer for ease of explanation. However, a RF receiver, such as the receiver 600, may comprise a plurality of mixers for demodulating a plurality of channels, such as, for example, I and Q channels, of the received signal. The received signal may also be downconverted to a single intermediate frequency (IF) channel, and the IF channel may be demodulated to, for example, the I and Q channels. Accordingly, a plurality of upstream analog information may be generated for a single channel, or for the plurality of channels, for example, the I and Q channels, of the received signal.

Figure 7:
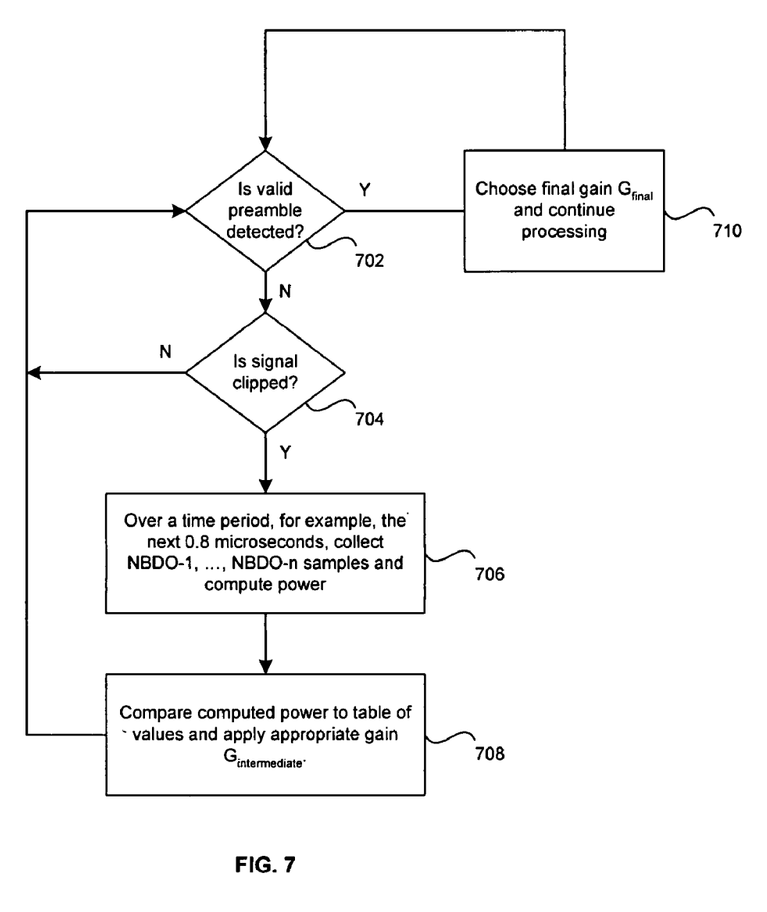
FIG. 7 is a flow chart illustrating exemplary steps that may be utilized for improving dynamic range using upstream analog information in accordance with an embodiment of the invention.

FIG. 7 is a flow chart illustrating exemplary steps that may be utilized for improving dynamic range using upstream analog information in accordance with an embodiment of the invention. Referring to FIG. 7, in step 702, it may be determined whether a valid preamble is detected. If a valid preamble is determined, in step 710, the final gain $G_{final}$ may be chosen and processing continued with step 702. If a valid preamble is not determined, in step 704, it may be determined whether the signal is clipped. If the signal is not clipped, processing continues at step 702. If the signal is clipped, then over a specified period, for example, 0.8 microseconds (µs), NBDO samples may be collected and the power computed. In step 708, the computed power may be compared to a table of values and the appropriate intermediate gain $G_{intermediate}$ may be applied. The period or interval over which samples are collected may be implementation dependent and other values other that 0.8 µs may be utilized. The value 0.8 µs has particular significance in 802.11 a/g applications. Accordingly, other applications may utilize a different value.

In instances where a wideband received signal (WRS) has not been bandwidth limited, a wideband received signal (WRSS) may not be digitally sampled without aliasing. However, analog processed information of the WRS may be band limited and may therefore be utilized to provide a useful measure for aiding with automatic gain control. In this regard, analog processed information of the WRS may be utilized to determine a more accurate final gain $G_{final}$ and/or a more accurate distribution of that final gain, which may be derived from the individually applied gain values of $G_1, G_2, \ldots, G_n$. In accordance with an embodiment of the invention, signals with a much wider dynamic range of received input powers may be more precisely demodulated. Accordingly, the receiver 600 of FIG. 6 provides a much wider dynamic range in the received input powers, which permits more accurate demodulation of the received signal.

Figure 8A:
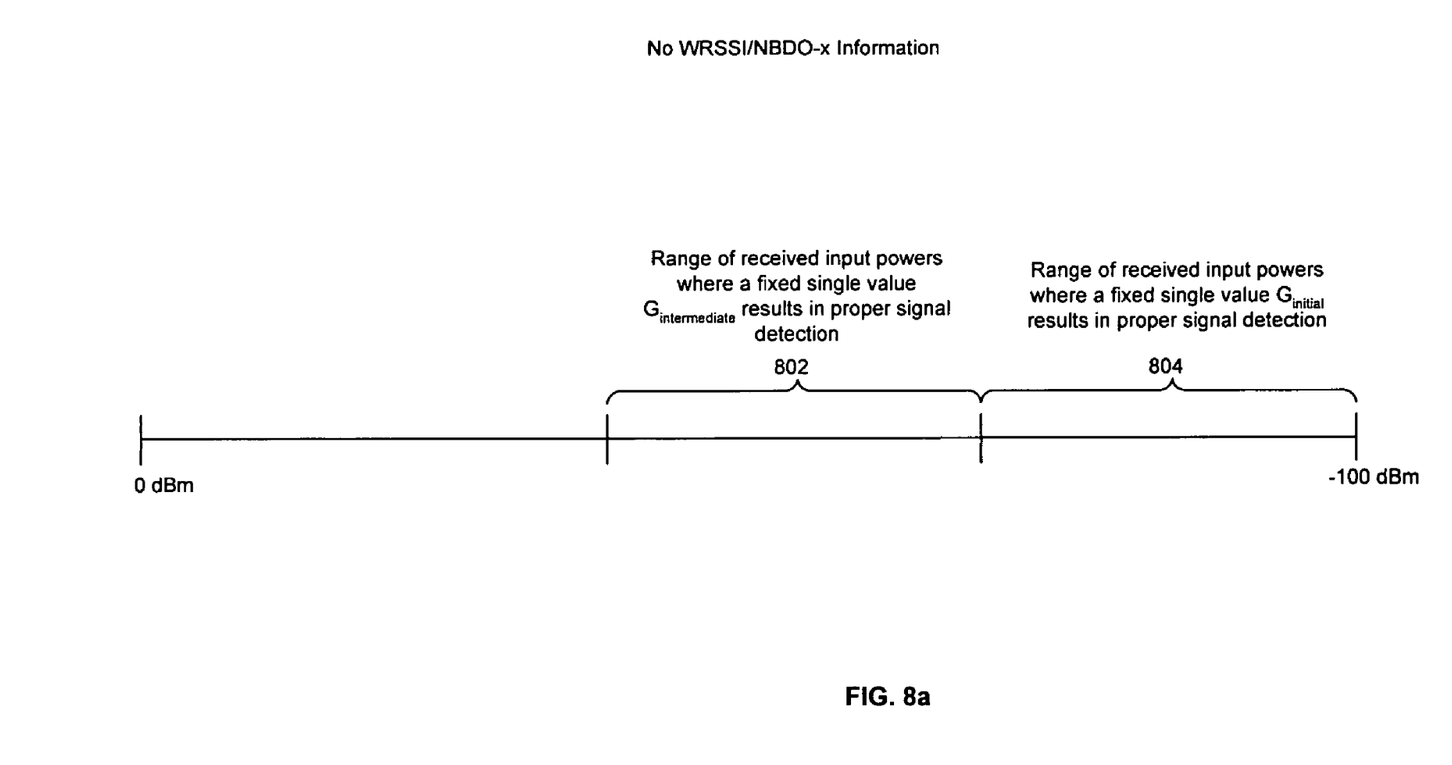
FIG. 8a is a diagram illustrating a case having no WRSSI and/or NBDO-x information, which may be utilized in connection with improving dynamic range using upstream analog information in accordance with an embodiment of the invention.

FIG. 8a is a diagram illustrating a case having no WRSSI and/or NBDO-x information, which may be utilized in connection with improving dynamic range using upstream analog information in accordance with an embodiment of the invention. Referring to FIG. 8a, there is illustrated a first range 802 and a second range 804. The range of 0 to –100 dBm is utilized for illustrative purposes and is not intended to limit the invention to a range of 100 dB. The first range 802 illustrates a range of received input powers where a fixed single value $G_{intermediate}$ results in a correctly received packet. The second range 804 illustrates a range of received input powers where a fixed single value $G_{initial}$ results in a correctly received packet.

Without access to information such as WRSSI and/or NBDO-x, higher received input powers cannot be differentiated using only the samples out of the ADC. If there is sufficient time to apply an intermediate gain $G_{intermediate}$, then at best only a single fixed value of $G_{intermediate}$ may be applied when a clip at the ADC has occurred. By doing so, the input range associated with this scheme may not be as large as would be otherwise possible if the intermediate gain value $G_{intermediate}$ was more intelligently chosen.

Figure 8B:
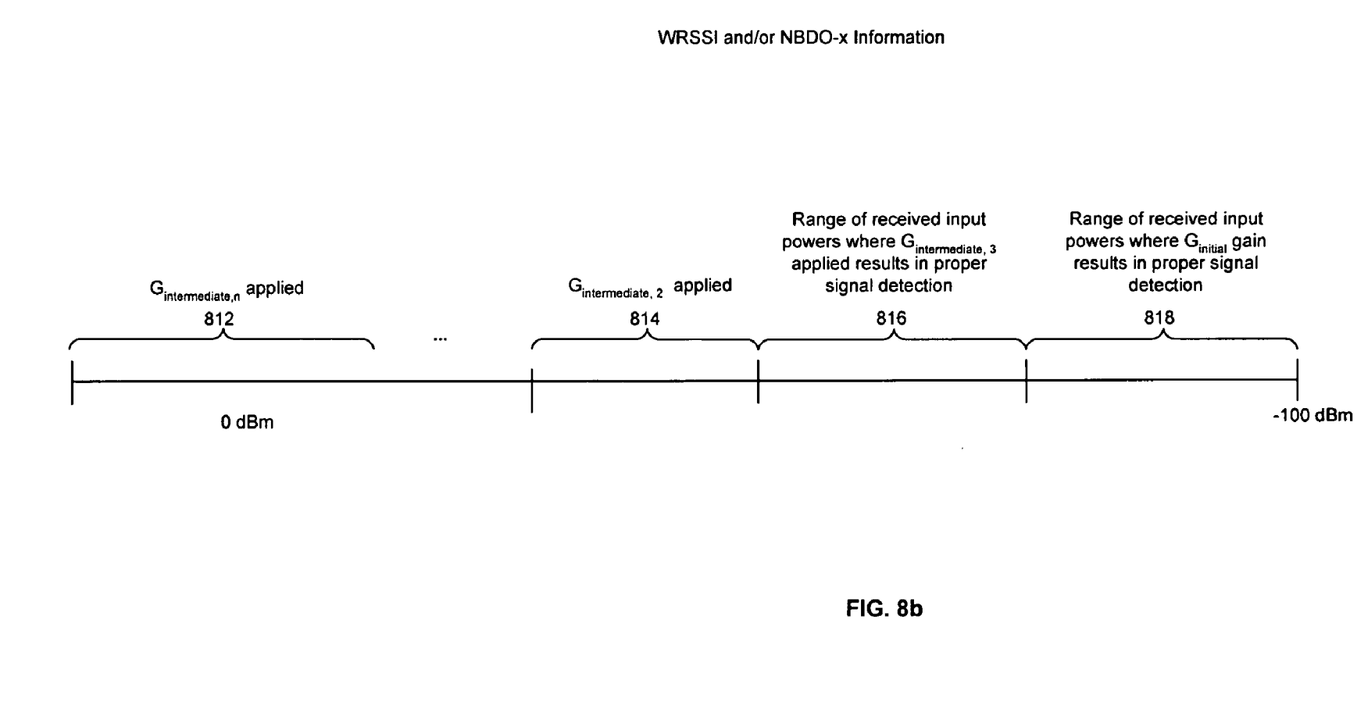
FIG. 8b is a diagram illustrating a case having WRSSI and/or NBDO-x information, which may be utilized in connection with improving dynamic range using upstream analog information in accordance with an embodiment of the invention.

FIG. 8b is a diagram illustrating a case having WRSSI and/or NBDO-x information, which may be utilized in connection with improving dynamic range using upstream analog information in accordance with an embodiment of the invention. Referring to FIG. 8b, there is illustrated a first range 818, a second range 816, a third range 814 up to an $n^{th}$ range 812. The range of 0 to −100 dBm is utilized for illustrative purposes and is not intended to limit the invention to a range of 100 dB. The range 812 illustrates a range of received input powers where a fixed single value $G_{intermediate,n}$ may be applied to result in a correctly received packet. The range 814 illustrates a range of received input powers where a fixed single value $G_{intermediate,2}$ may be applied to result in a correctly received packet. The range 816 illustrates a range of received input powers where a fixed single value $G_{intermediate,1}$ may be applied to result in a correctly received packet. The range 818 illustrates a range of received input powers where a fixed single value $G_{initial}$ may be applied to result in a correctly received packet. Accordingly, with the use of WRSSI and/or NBDO-x information, the intermediate gain that is applied may take on one of a plurality of values, resulting in an extension of the dynamic range of received input powers that may be correctly demodulated for a received packet.

With reference to FIG. 6, the receiver 600 may detect when a valid preamble for a packet is received and generate a plurality of upstream analog signals for the received packet. The generated plurality of upstream analog signals may comprise narrowband analog signals NBDO-1, NBDO-2, . . . , NBDO-n. A processor 622 may acquire upstream analog information related to at least a portion of the generated plurality of upstream analog signals. At least one of a plurality of gain blocks 606a, 606b, . . . , 606n may be adapted to adjust a gain for the received packet using at least a portion of the acquired upstream analog information to increase a dynamic range of the received packet.

The receiver 600 may further comprise at least one low pass filter 604 that is adapted to low pass filter the received packet. The processor 622 may acquire at least one sample from at least a portion the generated plurality of upstream analog signals NBDO-1, NBDO-2, . . . , NBDO-n and compute a power based on the acquired sample. The processor 622 may be adapted to determine when at least one of the generated plurality of upstream analog signals NBDO-1, NBDO-2, . . . , NBDO-n is clipped. At least one of the gain blocks 606a, 606b, . . . , 606n may generate an intermediate gain based on the computed power of the acquired sample. The processor 622 may apply the generated intermediate gain to at least one of the generated plurality of upstream analog signals BDO-1, NBDO-2, . . . , NBDO-n. After comparing the computed power to a plurality of defined power values, the processor 622 may select a gain based on a comparable power value. At least one of the gain blocks 606a, 606b, . . . , 606n may be utilized to apply a final gain to the received packet upon detecting a valid preamble. The receiver 600 may be adapted to convert the generated plurality of upstream analog signals NBDO-1, NBDO-2, . . . , NBDO-n to corresponding time domain signals.

Aspects of the invention provide improvements in dynamic range for an AGC algorithm utilizing information further up the analog processing chain. Reliability is also improved by processing NBDO-x information in the digital domain. While this method was discussed with respect to an 802.11 OFDM system, the invention is not so limited and similar gains may be achieved for any receiver architecture that encounters similar types of issues.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing received signals in a communication system, the method comprising:
   receiving an RF signal;
   generating a plurality of narrowband signals from said received RF signals;
   converting said at least a portion of said generated plurality of upstream narrowband signals to corresponding digital signals;
   calculating an intermediate gain, which enables carrier sense detection, for each of said at least a portion of said generated plurality of upstream narrowband signals based on a power of each of said corresponding digital signals and based on whether said of each of said corresponding digital signals is clipped; and
   adjusting a final gain of said received RF signal based on said calculated intermediate gain of each of said at least a portion of said generated plurality of upstream narrowband signals.

2. The method according to claim 1, comprising sampling said each of said at least a portion of said generated plurality of upstream narrowband signals during a training period.

3. The method according to claim 2, comprising determining a power of said each of said at least a portion of said generated plurality of upstream narrowband signals based on said sampling.

4. The method according to claim 3, comprising summing samples resulting from said sampling to determine said power of said each of said at least a portion of said generated plurality of upstream narrowband signals.

5. The method according to claim 4, comprising comparing said determined power of said each of said at least a portion of said generated plurality of upstream narrowband signals to defined threshold values.

6. The method according to claim 5, comprising selecting said final gain based on said comparing.

7. The method according to claim 5, comprising selecting a comparable power value corresponding to one of said defined threshold values as said final gain.

8. The method according to claim 5, wherein said defined threshold values are stored in a lookup table.

9. The method according to claim 1, comprising determining whether said corresponding digital signals is clipped during a preamble portion of packets in said received RF signals.

10. The method according to claim 1, comprising applying said calculated intermediate gain that enables said carrier sense detection to each of said at least a portion of said generated plurality of upstream narrowband signals.

11. A computer-readable medium having stored thereon, a computer program having at least one code section for processing received signals in a communication system, the at least one code section being executable by a computer for causing the computer to perform steps comprising:
    receiving an RF signal;
    generating a plurality of narrowband signals from said received RF signals;
    converting said at least a portion of said generated plurality of upstream narrowband signals to corresponding digital signals;
    calculating an intermediate gain, which enables carrier sense detection, for each of said at least a portion of said generated plurality of upstream narrowband signals based on a power of each of said corresponding digital signals and based on whether said of each of said corresponding digital signals is clipped; and
    adjusting a final gain of said received RF signal based on said calculated intermediate gain of each of said at least a portion of said generated plurality of upstream narrowband signals.

12. The computer-readable medium according to claim 11, comprising code for sampling said each of said at least a portion of said generated plurality of upstream narrowband signals during a training period.

13. The computer-readable medium according to claim 12, comprising code for determining a power of said each of said at least a portion of said generated plurality of upstream narrowband signals based on said sampling.

14. The computer-readable medium according to claim 13, comprising code for summing samples resulting from said sampling to determine said power of said each of said at least a portion of said generated plurality of upstream narrowband signals.

15. The computer-readable medium according to claim 14, comprising code for comparing said determined power of said each of said at least a portion of said generated plurality of upstream narrowband signals to defined threshold values.

16. The computer-readable medium according to claim 15, comprising selecting said final gain based on said comparing.

17. The computer-readable medium according to claim 15, comprising code for selecting a comparable power value corresponding to one of said defined threshold values as said final gain.

18. The computer-readable medium according to claim 15, wherein said defined threshold values are stored in a lookup table.

19. The computer-readable medium according to claim 11, comprising code for determining whether said corresponding digital signals is clipped during a preamble portion of packets in said received RF signals.

20. The computer-readable medium according to claim 11, comprising code for applying said calculated intermediate gain that enables said carrier sense detection to each of said at least a portion of said generated plurality of upstream narrowband signals.

21. A system for processing received signals in a communication system, the system comprising:
    at least one processor that enables receiving of an RF signal;
    said at least one processor enables generation of a plurality of narrowband signals from said received RF signals;
    said at least one processor enables converting of said at least a portion of said generated plurality of upstream narrowband signals to corresponding digital signals;
    said at least one processor enables calculation of an intermediate gain, which enables carrier sense detection, for each of said at least a portion of said generated plurality of upstream narrowband signals based on a power of each of said corresponding digital signals and based on whether said of each of said corresponding digital signals is clipped; and
    said at least one processor enables adjusting of a final gain of said received RF signal based on said calculated intermediate gain of each of said at least a portion of said generated plurality of upstream narrowband signals.

22. The system according to claim 21, wherein said at least one processor enables sampling of said each of said at least a portion of said generated plurality of upstream narrowband signals during a training period.

23. The system according to claim 22, wherein said at least one processor enables determining of a power of said each of said at least a portion of said generated plurality of upstream narrowband signals based on said sampling.

24. The system according to claim 23, wherein said at least one processor enables summing of samples resulting from said sampling to determine said power of said each of said at least a portion of said generated plurality of upstream narrowband signals.

25. The system according to claim 24, wherein said at least one processor enables comparing of said determined power of said each of said at least a portion of said generated plurality of upstream narrowband signals to defined threshold values.

26. The system according to claim 25, wherein said at least one processor enables selecting of said final gain based on said comparing.

27. The system according to claim 25, wherein said at least one processor enables selecting of a comparable power value corresponding to one of said defined threshold values as said final gain.

28. The system according to claim 25, wherein said defined threshold values are stored in a lookup table.

29. The system according to claim 21, wherein said at least one processor enables determining of whether said corresponding digital signals is clipped during a preamble portion of packets in said received RF signals.

30. The system according to claim 21, wherein said at least one processor enables applying of said calculated intermediate gain that enables said carrier sense detection to each of said at least a portion of said generated plurality of upstream narrowband signals.

* * * * *